(12) United States Patent
Li (10) Patent No.: US 11,169,881 B2
(45) Date of Patent: Nov. 9, 2021

(54) SYSTEM AND METHOD FOR FACILITATING REDUCTION OF COMPLEXITY AND DATA MOVEMENT IN ERASURE CODING MERGING ON JOURNAL AND DATA STORAGE DRIVE

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 16/834,861

(22) Filed: Mar. 30, 2020

(65) Prior Publication Data

US 2021/0303400 A1 Sep. 30, 2021

(51) Int. Cl.
| | |
|---|---|
| *G06F 11/10* | (2006.01) |
| *H04L 29/08* | (2006.01) |
| *H03M 13/15* | (2006.01) |
| *H03M 13/29* | (2006.01) |
| *H04L 12/24* | (2006.01) |

(52) U.S. Cl.
CPC ....... *G06F 11/1096* (2013.01); *H03M 13/154* (2013.01); *H03M 13/2906* (2013.01); *H04L 41/5003* (2013.01); *H04L 67/1097* (2013.01)

(58) Field of Classification Search
CPC ............. G06F 11/1096; H03M 13/154; H03M 13/2906; H04L 41/5003; H04L 67/1097
See application file for complete search history.

(56) References Cited

U.S. PATENT DOCUMENTS

| | | | |
|---|---|---|---|
| 7,351,072 B2 | 4/2008 | Muff | |
| 9,607,631 B2 | 3/2017 | Rausch | |
| 9,852,076 B1 | 12/2017 | Garg | |
| 10,649,657 B2 | 5/2020 | Zaidman | |
| 2008/0065805 A1 | 3/2008 | Wu | |
| 2008/0082731 A1 | 4/2008 | Karamcheti | |
| 2011/0252188 A1 | 10/2011 | Weingarten | |
| 2012/0203958 A1 | 8/2012 | Jones | |
| 2013/0024605 A1 | 1/2013 | Sharon | |
| 2016/0077749 A1 | 3/2016 | Ravimohan | |
| 2016/0103631 A1 | 4/2016 | Ke | |
| 2017/0192848 A1* | 7/2017 | Pamies-Juarez | .... G06F 11/1076 |

(Continued)

*Primary Examiner* — Guy J Lamarre
(74) *Attorney, Agent, or Firm* — Shun Yao; Park, Vaughan, Fleming & Dowler LLP (57) ABSTRACT

A system is provided for performing erasure coding (EC) in a distributed storage system. During operation, the system can perform a partial encoding of a received first set of data fragments and second set of data fragments using EC to generate a first and a second EC codeword, respectively. The system can then distribute the first and the second set of data fragments among a set of storage nodes within the distributed storage system. The system can also distribute a first and the second set of intermediate parity fragments in the first and second EC codeword, respectively, among a subset of the storage nodes with alignments. The system can then merge the first and the second set of intermediate parity fragments to generate an overall parity for both the first and the second set of data fragments. The system can store, based on the alignments, each overall parity fragment in the overall parity in the corresponding subset of storage nodes.

20 Claims, 9 Drawing Sheets

(56) References Cited

U.S. PATENT DOCUMENTS

| | | | |
|---|---|---|---|
| 2017/0322888 A1 | 11/2017 | Booth | |
| 2018/0165340 A1* | 6/2018 | Agarwal | G06F 16/245 |
| 2018/0173620 A1 | 6/2018 | Cen | |
| 2018/0226124 A1 | 8/2018 | Perner | |
| 2018/0373664 A1 | 12/2018 | Vijayrao | |
| 2019/0065085 A1 | 2/2019 | Jean | |
| 2019/0087115 A1 | 3/2019 | Li | |
| 2019/0272242 A1 | 9/2019 | Kachare | |
| 2019/0278654 A1 | 9/2019 | Kaynak | |
| 2020/0013458 A1 | 1/2020 | Schreck | |
| 2020/0042223 A1 | 2/2020 | Li | |
| 2020/0159425 A1 | 5/2020 | Flynn | |
| 2020/0409791 A1* | 12/2020 | Devriendt | G06F 11/1076 |

\* cited by examiner

SYSTEM AND METHOD FOR FACILITATING REDUCTION OF COMPLEXITY AND DATA MOVEMENT IN ERASURE CODING MERGING ON JOURNAL AND DATA STORAGE DRIVE

BACKGROUND

Field

This disclosure is generally related to the field of data storage. More specifically, this disclosure is related to a system and method for facilitating reduction of complexity and data movement in erasure encoding merging on journal and data storage drive.

Related Art

Today, various distributed storage systems have been created to access and store the ever-increasing amount of digital content. In particular, distributed storage systems are applied as a systematic solution to achieve low cost, thin provisioning, global pooling, and data consistency. However, network bandwidth and storage capacity of physical resources are two characteristics of distributed storage systems which can greatly impact their performance, cost, and efficiency.

Even with the addition of storage capacity to a distributed storage system, the physical bandwidth can still only support a certain number of users, e.g., to satisfy the requirements of a Service Level Agreement (SLA). For example, when a distributed storage system experiences a heavy load of simultaneous incoming traffic, some drives may become non-responsive due to a lack of sufficient bandwidth, even if sufficient storage capacity is available. This can result in an increased latency for certain applications/users. Thus, while thin-provisioning can be useful for handling or increasing storage capacity in a distributed storage system, maintaining or increasing the network bandwidth remains a challenge.

Furthermore, traditional distributed storage systems suffer from a long data path which partially leads to long latency. In addition, the distributed storage systems maintain multiple copies of the data in the plurality of storage nodes in a storage cluster, thereby causing sub-optimal usage of capacity and resulting in high write amplification. Therefore, some challenges still remain in providing an improved performance with regards to latency, SLA, etc., and an improved efficiency with respect to resource consumption, network load, write amplification, etc., in the distributed storage system.

SUMMARY

One embodiment of the present disclosure provides a system and method for facilitating erasure coding in a distributed storage system. During operation, the system can receive at a co-processor of a storage node in a set of storage nodes in the distributed storage system, a first set of data fragments and a second set of data fragments. The system can perform, by using an erasure coding (EC) encoder in the co-processor, partial encoding of the first set of data fragments using EC to generate a first EC codeword. The first EC codeword can include the first set of data fragments and a first set of intermediate parity fragments. The system can further perform, by using the EC encoder in the co-processor, partial encoding of the second set of data fragments using EC to generate a second EC codeword. The second EC codeword can include the second set of data fragments and a second set of intermediate parity fragments.

The system can then distribute the first set of data fragments and the second set of data fragments among the set of storage nodes. Next, the system can distribute the first set of intermediate parity fragments and the second set of intermediate parity fragments among a subset of the storage nodes with alignments. The system can merge the first set of intermediate parity fragments and the second set of intermediate parity fragments to generate an overall parity for both the first set of data fragments and the second set of data fragments. The system can then store, based on the alignments, each overall parity fragment in the overall parity in the corresponding subset of the storage nodes.

In some embodiments, the system can distribute the first set of data fragments and the second set of data fragments among the set of storage nodes, by: assigning, among a set of journals corresponding to the set of storage nodes, each data fragment in the first set of data fragments and the second set of data fragments based on local address matching associated with a journal where the same data fragment is stored temporarily.

In some embodiments, the system can distribute the first set of intermediate parity fragments and the second set of intermediate parity fragments among the set of storage nodes with alignments by: storing each fragment in the first set of intermediate parity fragments in a journal on a separate storage node in the subset of the storage nodes, wherein each intermediate parity fragment is associated with a different position in the first EC codeword; and storing each fragment in the second set of intermediate parity fragments in the same journal on the same storage node as the corresponding intermediate parity fragment in the first set of intermediate parity fragments sharing a same position in the second EC codeword.

In some embodiments, the system can merge the first set of intermediate parity fragments and the second set of intermediate parity fragments to generate an overall parity, by: generating the overall parity by performing a bit-wise addition of each intermediate parity fragment in the first set of intermediate parity fragments with a corresponding intermediate parity fragment in the second set of intermediate parity fragments.

In some embodiments, when the system generates the overall parity, each co-processor in a storage node can locally copy each data fragment in the first set of data fragments and the second set of data fragments from a corresponding journal to a persistent data storage drive in the same storage node, thereby reducing data movement and network traffic in the distributed storage system.

In some embodiments, the system can store, based on the alignments, each overall parity fragment in the overall parity in the corresponding subset of the storage nodes, by: storing each overall parity fragment in a persistent data storage drive associated with a same storage node where corresponding intermediate parity fragments used for computing the overall parity fragment are stored, wherein the intermediate parity fragments are associated with the first set of intermediate parity fragments and the second set of intermediate parity fragments.

In some embodiments, each storage node in the distributed storage system can be coupled to other storage nodes in the set of storage nodes via a data center network.

In some embodiments, each storage node can include: a central processing unit (CPU) complex; a co-processor including the EC encoder for performing EC; an interface for communications between the CPU complex and the co-processor; a journal; and a persistent data storage drive.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

Traditional distributed storage systems store multiple copies of data in a plurality of storage nodes in a storage cluster to provide high reliability. However, storing such multiple copies can result in sub-optimal usage of storage capacity and results in high write amplification. Therefore, to improve storage efficiency in the distributed storage systems erasure coding is used to provide a competent data reliability.

Erasure coding is a data protection method in which the data is partitioned into fragments, expanded, and encoded with redundancy, and then stored across a plurality of different drives in a distributed storage system. Erasure coding has been used to reduce the burden of compaction. Compared to other methods that produce multiple replicas, erasure coding based compaction can reduce the total amount of recycled data. However, conventional erasure coding based compaction still has a number of drawbacks, including inefficient use of computing resources and network bandwidth. Such a conventional distributed storage system and erasure coding technique is described below in relation to FIG. 1A and FIG. 1B.

The embodiments described herein overcome the above-mentioned drawbacks. Specifically, according to one embodiment of present disclosure, during operation, the system can receive at a co-processor of a storage node in a set of storage nodes in the distributed storage system, a first set of data fragments and a second set of data fragments. The system can perform, by using an erasure coding (EC) encoder in the co-processor, partial encoding of the first set of data fragments using EC to generate a first EC codeword. The first EC codeword can include the first set of data fragments and a first set of intermediate parity fragments. The system can further perform, by using the EC encoder in the co-processor, partial encoding of the second set of data fragments using EC to generate a second EC codeword. The second EC codeword can include the second set of data fragments and a second set of intermediate parity fragments.

The system can then distribute the first set of data fragments and the second set of data fragments among the set of storage nodes. Next, the system can distribute the first set of intermediate parity fragments and the second set of intermediate parity fragments among a subset of the set of storage nodes with alignments. The system can merge the first set of intermediate parity fragments and the second set of intermediate parity fragments to generate an overall parity for both the first set of data fragments and the second set of data fragments. The system can then store, based on the alignments, each overall parity fragment in the overall parity in the corresponding subset of the storage nodes. Such partial erasure coding operations, distribution of data and intermediate parity parts among the storage nodes, and merging of the intermediate parity parts are described below in relation to FIG. 2A, FIG. 2B, FIG. 3A, FIG. 3B, FIG. 3C, FIG. 3D, and FIG. 4.

Therefore, by applying erasure coding related improvements as described in the present disclosure, the system can be capable of reducing latency, saving resources, and enhancing efficiency of the distributed storage system. Furthermore, the embodiments described herein provide a system which improves the efficiency of a distributed storage system, where the improvements are fundamentally technological. The system provides a technological solution (by using erasure encoding merging) to the technological problem of un-necessary data movements, suboptimal erasure coding data spreading causing high write amplification, and high burden on CPU cores for performing erasure coding.

The term "distributed storage system" refers to a set of compute nodes (or client servers) interacting through a set of storage servers (or storage nodes) via a network, such as a data center network. The terms "storage server" and "storage node" are used interchangeably.

The term "storage cluster" refers to a group of storage servers.

The term "storage server" refers to a server in a distributed storage system. A storage server can have multiple drives, where data may be written on to a drive for persistent storage. A storage server can also include a journal associated with the journaling file system. A drive can also include a storage, storage medium, or other storage means associated with the drive.

The term "journal" refers to a data structure or a serial log maintained by a journaling file system to track changes that are yet to be committed to a main file system to maintain data integrity.

Distributed Storage System Architecture and an Erasure Coding Scheme

Figure 1A:
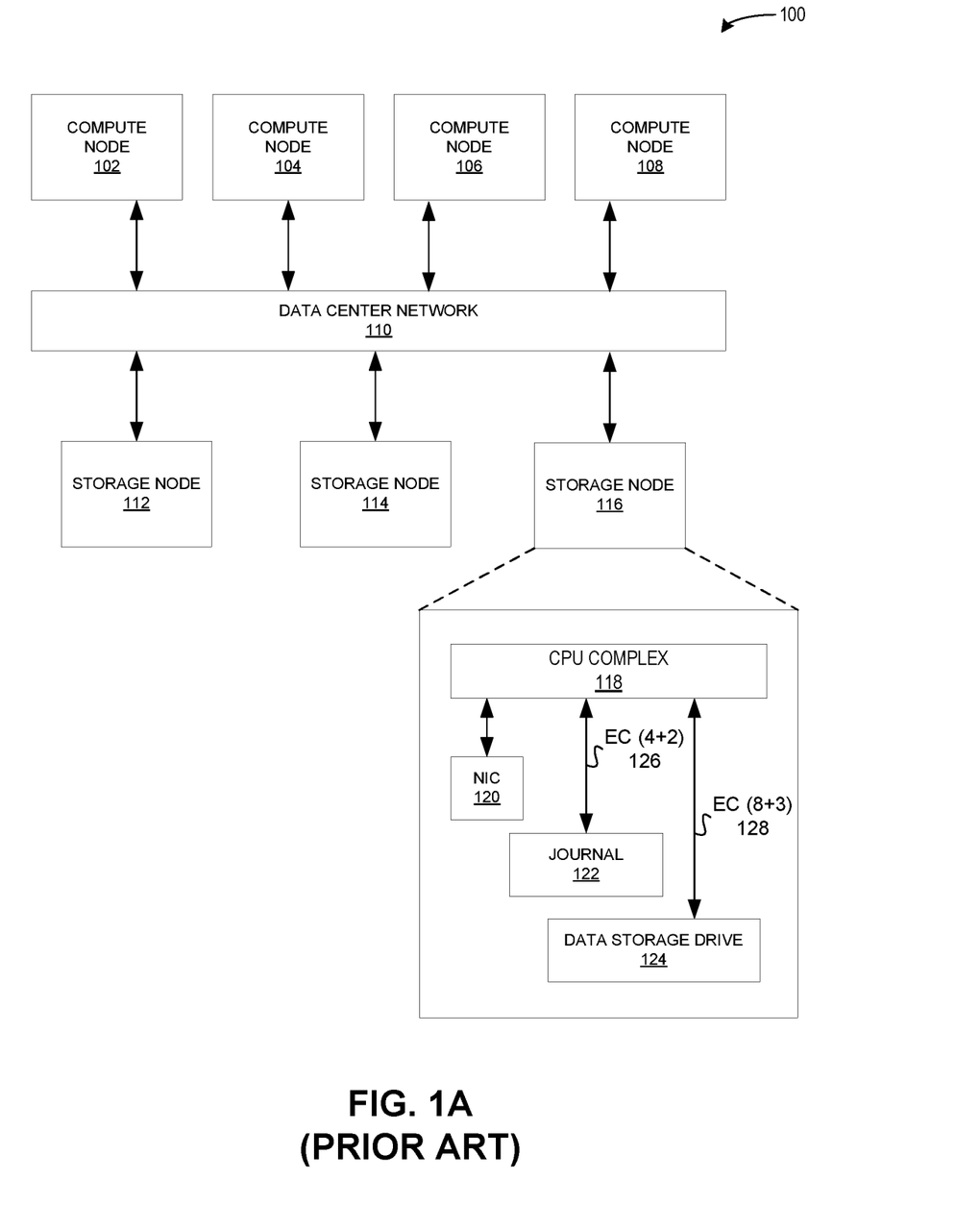
FIG. 1A illustrates an exemplary distributed storage system architecture, in accordance with the prior art.

FIG. 1A illustrates an exemplary distributed storage system architecture, in accordance with the prior art. Distributed storage system 100 can include a set of compute nodes (client servers or client-serving machines) 102, 104, 106, and 108, and a set of storage nodes (or storage servers) 112, 114, and 116. Compute nodes 102-106 and storage nodes 112-116 can communicate with each other via a computer network, e.g., a data center network 110. Each storage node can include: a CPU complex 118, a network interface card (NIC) 120, a journal 122, and data storage drive 124. CPU complex 118 can include a multitude of CPU cores for processing data and for performing EC of the received data.

When distributed storage system 100 receives data to be stored in data storage drive, e.g., data storage drive 124, associated with a storage node, e.g., storage node 116, distributed storage system 100 can send the data toward storage node 116 via data center network 110. The data received at storage node 116, is forwarded to CPU complex 118 via NIC 120. CPU complex 118 can perform EC on the received data. Distributed storage system 100 can use EC to alleviate the suboptimal usage of storage resources and to provide a competent data reliability.

Traditionally, distributed storage system 100 first writes the received data to a journal, e.g., journal 122, and then writes the data to persistent data storage drive 124. In other words, a traditional write operation can be divided into two steps: first is to write the EC protected data into low-latency journal 122, and second, is to copy the EC protected data from journal 122 to data storage drive 124. A write operation is committed after the EC protected data is written to the journal. To maintain the advantages of using expensive journals and for efficient usage of storage capacity, distributed storage system 100 can encode the data input to journal 122 with a low-rate code, e.g., (4+2) EC 126, while distributed storage system 100 can apply a high-rate code, e.g., (8+3) EC 128, when writing data from journal 122 to data storage drive 124. A detailed description of the EC and data distribution scheme used by distributed storage system 100 is given below in relation to FIG. 1B.

Figure 1B:
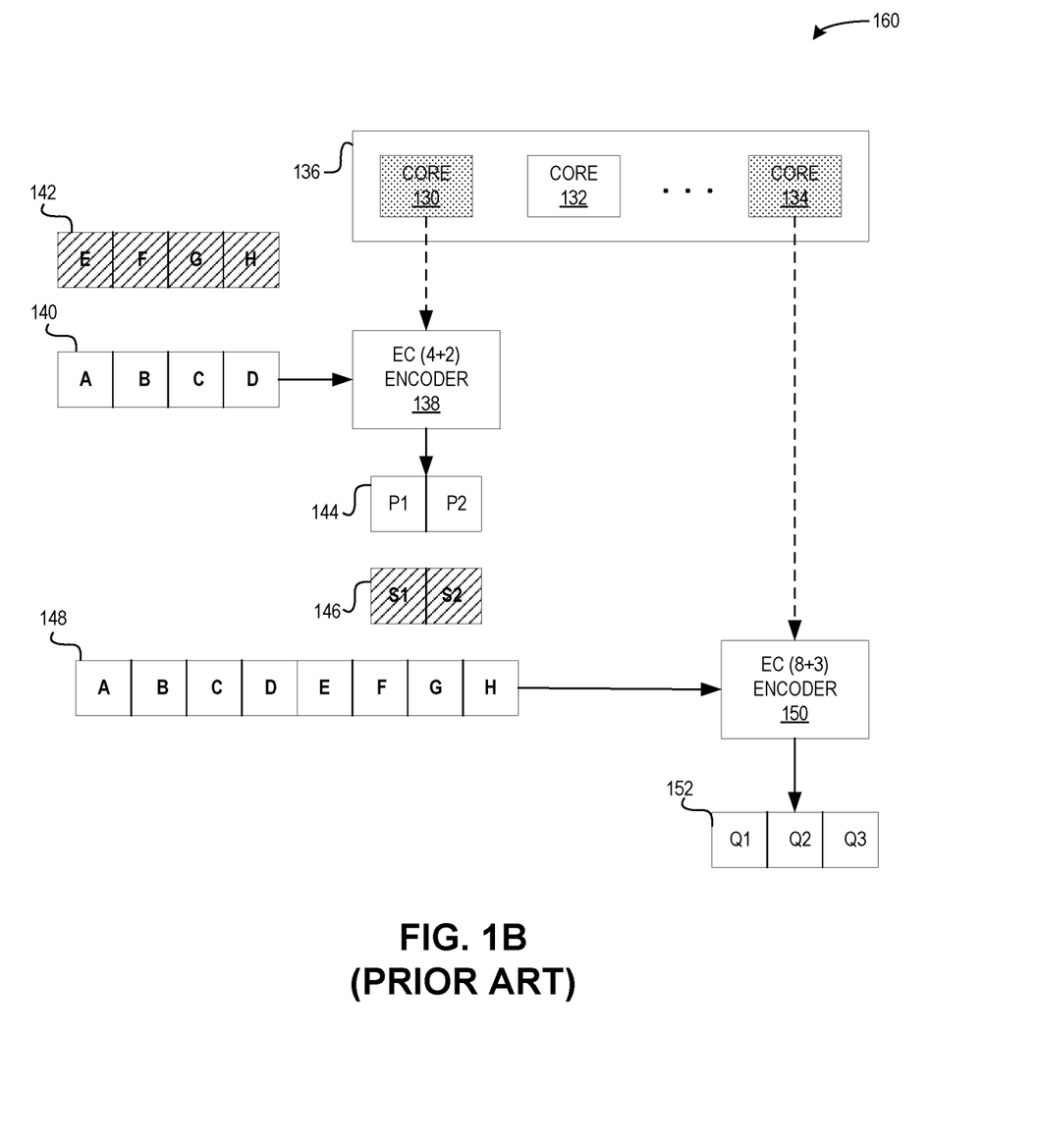
FIG. 1B illustrates a conventional erasure coding scheme, in accordance with the prior art.

FIG. 1B illustrates a conventional erasure coding scheme 160, in accordance with the prior art. During a conventional EC operation within distributed storage system 100, data at the input of a storage node, e.g., storage node 116, can include a number of user data portions or data fragments, e.g., {A, B, C, D, E, F, G, H}. Prior to writing the user data portions to journal 122, the user data portions are encoded using EC. All the data processing operations and EC encoding are performed by one or more cores, i.e., cores 130, 132, and 134, in CPU complex 136. For example, core 130 can use an EC (4+2) encoder 138 to first perform low rate EC on a first half 140, e.g., {A, B, C, D}, of the user data portions, and generate a first EC codeword, e.g., {A, B, C, D, P1, P2} with parity 144 {P1, P2}. Similarly, core 130 can use EC (4+2) encoder 138 to perform EC on a second half 142, e.g., {E, F, G, H}, of the user data portions to generate a second EC codeword, e.g., {E, F, G, H, S1, S1}, with parity 146 {S1, S2}. After core 130 has generated the first EC codeword and the second EC codeword, distributed storage system 100 can store the each of the EC codeword in a journal, e.g., journal 122.

CPU complex 136 can subsequently distribute the first EC codeword and the second EC codeword among storage nodes in distributed storage system 100. More specifically, the different data chunks, including user data portions: {A, B, C, D, E, F, G, H} and parity data: {P1, P2, S1, S2}, can be randomly dispersed among the various storage nodes 112-116 of distributed storage system 100. CPU complex 136 may then store the randomly dispersed user data portion and parity data in a corresponding journal associated with a storage node. One or more cores, e.g., core 130, in CPU complex 136 can decode the first EC codeword and the second EC codeword using a EC (4+2) decoder (not shown in FIG. 1B but form a part of EC 4+2 codec that includes EC (4+2) encoder 138) to re-generate the user data portions 148, e.g., {A, B, C, D, E, F, G, H}, prior to CPU complex 136 moving the dispersed data and parity chunks associated with the two generated codeword's asynchronously from the journals to corresponding data storage drives.

Core 134 can then apply EC (8+3) encoder 150 to re-generated user data portions 148 to generate a new EC codeword, e.g., {A, B, C, D, E, F, G, H, Q1, Q2, Q3}, with parity 152: {Q1, Q2, Q3}. CPU complex 136 can subsequently store the data and parity chunks in the new EC codeword in corresponding data storage drives in distributed storage system 100. More specifically, CPU complex 136 can store the different data chunks including user data portions: {A, B, C, D, E, F, G, H} and new parity data: {Q1, Q2, Q3}, in corresponding data storage drives associated with storage nodes 112-116 in distributed storage system 100.

This conventional distributed storage system 100 including a conventional erasure coding scheme 160 is inefficient in terms of computing resources and network bandwidths, due to the following reasons. Distributed storage system 100 has to maintain in each storage node two EC codec's, e.g., (4+2) EC codec and (8+3) EC codec. Such a maintenance of two EC codec's in each storage node results in inclusion of hardware, software, and firmware implementation. Furthermore, since all the EC operations are performed by CPU cores 130-134 in CPU complex 136, resources in CPU cores 130-134 are un-necessarily consumed for EC encodings of same set of data, e.g., {A, B, C, D, E, F, G, H}, at different stages.

In addition, EC scheme 160 introduces sub-optimal EC data spreading across the set of storage nodes 112-116 in distributed storage system 100. Specifically, for each EC encoding, distributed storage system 100 randomly distributes the user data portions and parity portions in EC codeword among storage nodes 112-116, which leads to unnecessary data movement. Such data movements can increase the burden on the network and storage in distributed storage system 100. Furthermore, after an EC operation, same data e.g., {A, B, C, D, E, F, G, H}, are moved to other storage drives in a different storage node in distributed storage system 100. Such un-necessary rewriting of same data can increase write amplification introduced by the sub-optimal EC data spreading.

Embodiments disclosed herein describe an efficient erasure coding merging technique for a distributed storage system implementing erasure coding. More specifically, instead of the distributed storage system maintaining two codec's it may maintain only one (8,3) EC codec, which can provide data protection to both the journal and the data storage drive. Furthermore, the distributed storage system of the present disclosure can transmit the received user data portions to co-processor hardware including an EC codec. Hence, the CPU cores in CPU complex can be released from the low-efficiency utilization caused by implementing an EC technique.

Figure 2A:
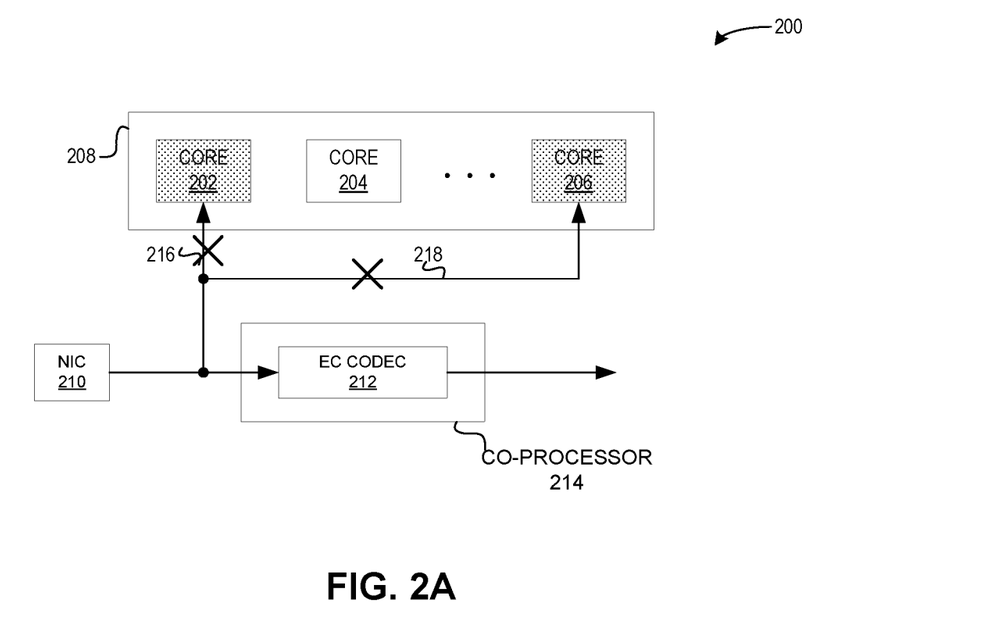
FIG. 2A illustrates an exemplary scenario of a novel erasure coding based off-loading by a co-processor in a distributed storage system, in accordance with an embodiment of the present disclosure.

FIG. 2A illustrates an exemplary scenario 200 of a novel erasure coding based off-loading by a co-processor in a distributed storage system, in accordance with an embodiment of the present disclosure. In FIG. 2A, when user data is received at a storage node in a distributed storage system via NIC 210, the distributed storage system can transmit the received data to co-processor hardware 214 instead of directing the received data via paths 216 and 218 to CPU cores 202-206. Co-processor hardware 214 can include an EC codec 212 which can be implemented using an application-specific integrated circuit (ASIC) or field-programmable gate array (FPGA) instead of software running on CPU cores 202-206 in the distributed storage system. Thus, CPU cores 202-206 can be released from the low-efficiency utilization that can be caused due to the computational complexity of the EC technique. Such off-loading of EC associated data processing operations by co-processor 214 is transparent to applications accessing a storage node in the distributed storage system. In other words, the applications need not be subject to any modifications, and interface NIC 212 can be the same and can be transparent to the applications.

Figure 2B:
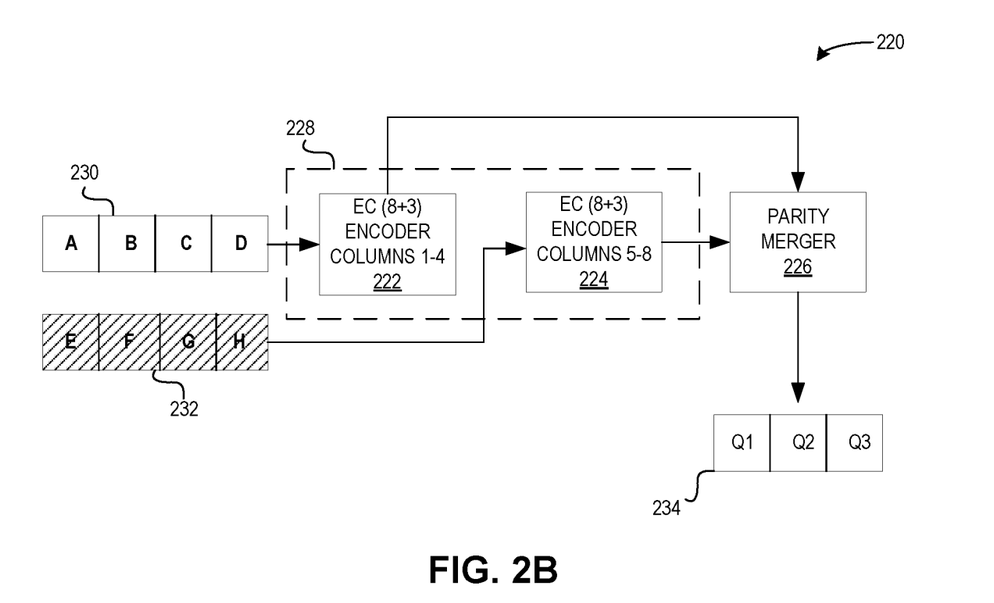
FIG. 2B illustrates an exemplary system for performing erasure coding by a co-processor, in accordance with an embodiment of the present disclosure.

FIG. 2B illustrates an exemplary system 220 for performing erasure coding by a co-processor, in accordance with an embodiment of the present disclosure. FIG. 2B illustrates how EC can be performed by co-processor 214. System 220 can include a single EC encoder 228 for performing EC on user data. EC encoder 228 can be a part of EC codec 212. System 220 can use same EC codec 212 for performing (8+3) EC on user data, e.g., {A, B, C, D, E, F, G, H}, prior to storing the user data on a journal and a data storage drive in a storage node of a distributed storage system. Specifically, when a first user data portion 230, e.g., {A, B, C, D} arrives at the input of EC encoder 228, a first portion 222 of EC(8+3) encoder 228 can be used to start performing partial EC on the first user data portion. For example, EC (8+3) encoder 222 associated with columns 1-4 in a parity check matrix (the parity check matrix is described below in relation to FIGS. 4A-4D), can be used to perform partial EC on first user data portion 230 which can include four data fragments. EC (8+3) encoder 222 can then output a first EC codeword including a first intermediate parity and the first user data portion 230.

Next, when a second user data portion 232, e.g., {E, F, G, H}, arrives at the input of EC encoder 228 subsequent to the arrival of first user data portion 230, a second portion 224 of EC encoder 228 can start performing partial encoding on a second portion of user data 232. For example, an EC (8+3) encoder 224 with columns 5-8 in the parity check matrix can be used to perform partial EC on second user data portion 232 which can include four data fragments. EC (8+3) encoder 224 can then output a second EC codeword including a second intermediate parity and second user data portion 232. In one embodiment, EC (8+3) encoder 222 and EC (8+3) encoder 224 can operate in parallel.

System 220 can then distribute data and parity fragments in the first EC codeword and the second EC codeword among the set of storage nodes in the distributed storage system. System 220 can first store the data and parity fragments in a journal associated with a corresponding storage node. System 220 can send the first intermediate parity and the second intermediate parity to a parity merger 226 to generate an overall parity 234, e.g., {Q1, Q2, Q3}, for maintaining data consistency in the data storage drive at the storage node, prior to moving the user data from a journal to a corresponding data storage drive sharing the same storage node, Specifically, parity merger 226 can combine the first intermediate parity with the second intermediate parity to obtain overall parity 234 for the user data, e.g., {A, B, C, D, E, F, G, H}.

Figure 3A:
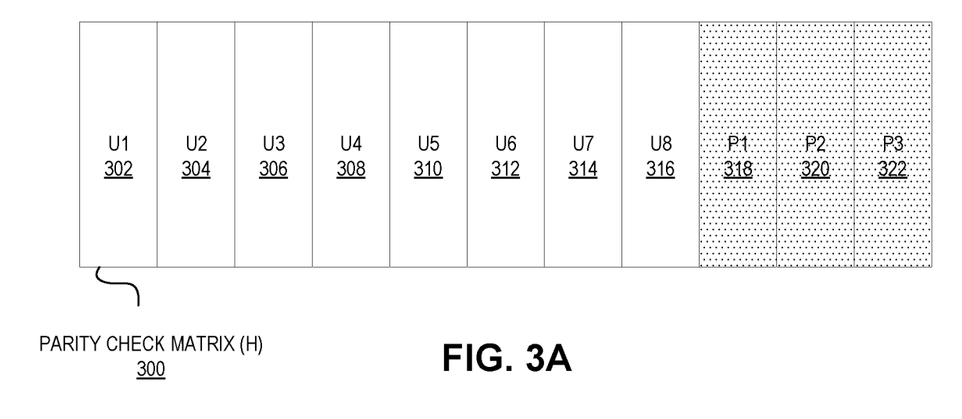
FIG. 3A illustrates an exemplary example of a parity check matrix, in accordance with an embodiment of the present disclosure.

FIG. 3A illustrates an exemplary example of a parity check matrix 300, in accordance with an embodiment of the present disclosure. Parity check matrix (H) 300 used by (8+3) EC encoder 228 can be of size(n–k)×n, where n denotes the codeword length, e.g., eleven, and k the length of user data portion, e.g., eight. In parity check matrix (H) 300, U1-U8 (302-316) can represent elements corresponding to user data portions, and P1, P2, and P3 (318-322) can represent elements corresponding to parity portions of parity check matrix 300.

Figure 3B:
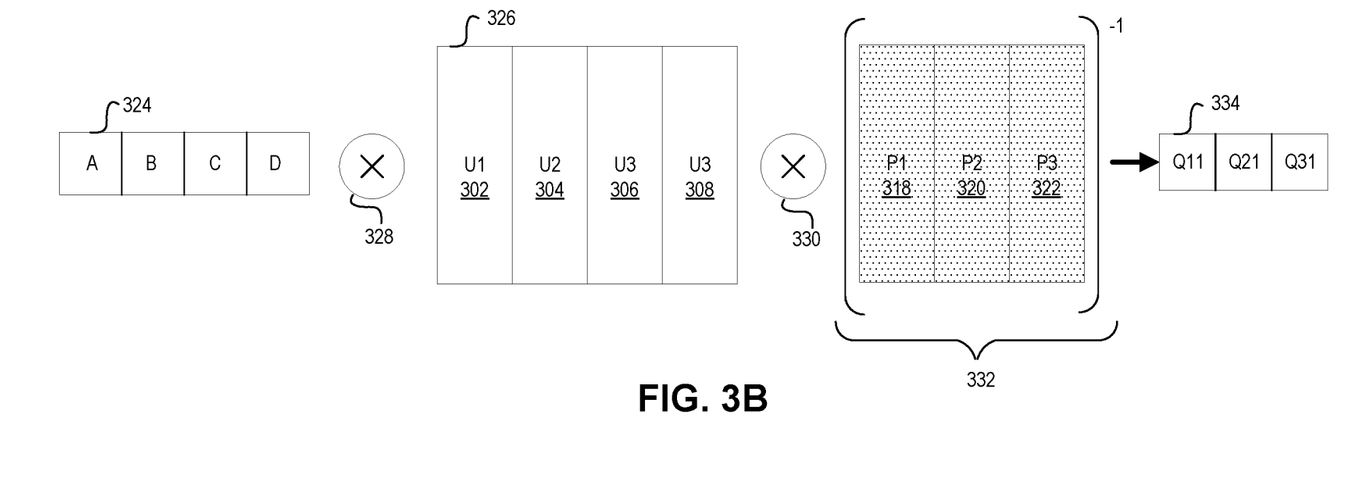
FIG. 3B illustrates an exemplary example for partial erasure coding by using a first half of the parity check matrix, in accordance with an embodiment of the present disclosure.

FIG. 3B illustrates an exemplary example for partial erasure coding by using a first half of the parity check matrix, in accordance with an embodiment of the present disclosure. FIG. 3B represents a first stage in EC by using (8+3) EC encoder (element 222 shown in FIG. 2B). In one embodiment, when a storage node in the distributed storage system including a set storage nodes, e.g., eight storage nodes, receives a first portion of data 324, (8+3) EC encoder (element 222 shown in FIG. 2B) may use a sub-matrix 326 of parity check matrix 300 to perform partial EC. Specifically, (8+3) EC encoder may apply a sub-matrix 326 to first portion of data 324 using operation 328, e.g., matrix multiplication operation, to obtain a first intermediate syndrome. This first intermediate syndrome is then reversed through an operation 330, e.g., matrix multiplication operation, with a parity portion 332 of parity check matrix 300 to generate a first intermediate parity 334, e.g., {Q11, Q21, Q31}.

A first EC codeword obtained in this first stage of EC can be denoted as: {A, B, C, D, 0, 0, 0,0, Q11, Q21, Q31}. Note that each intermediate parity fragment in first intermediate parity 334 can be identified based on their position occupied in the first EC codeword. For example, Q11 can denote a first intermediate party fragment in the first EC codeword, Q21 can denote a second intermediate party fragment in the first EC codeword, and Q31 can denote a third intermediate party fragment in the first EC codeword. The system can first save this first EC codeword in the journal associated with a first storage node in which the first EC codeword was generated. However, when dispersing the first EC codeword across the other storage nodes in the distributed storage system, the system may write {A, B, C, D, Q11, Q21, Q31} into journals in the remaining seven storage nodes in the distributed storage system with eight storage nodes in a storage cluster. Note that when the system writes the first EC codeword to the other seven storage nodes, the zeros are omitted. However, the omitted zeros can be padded later if needed during a decoding operation.

Figure 3C:
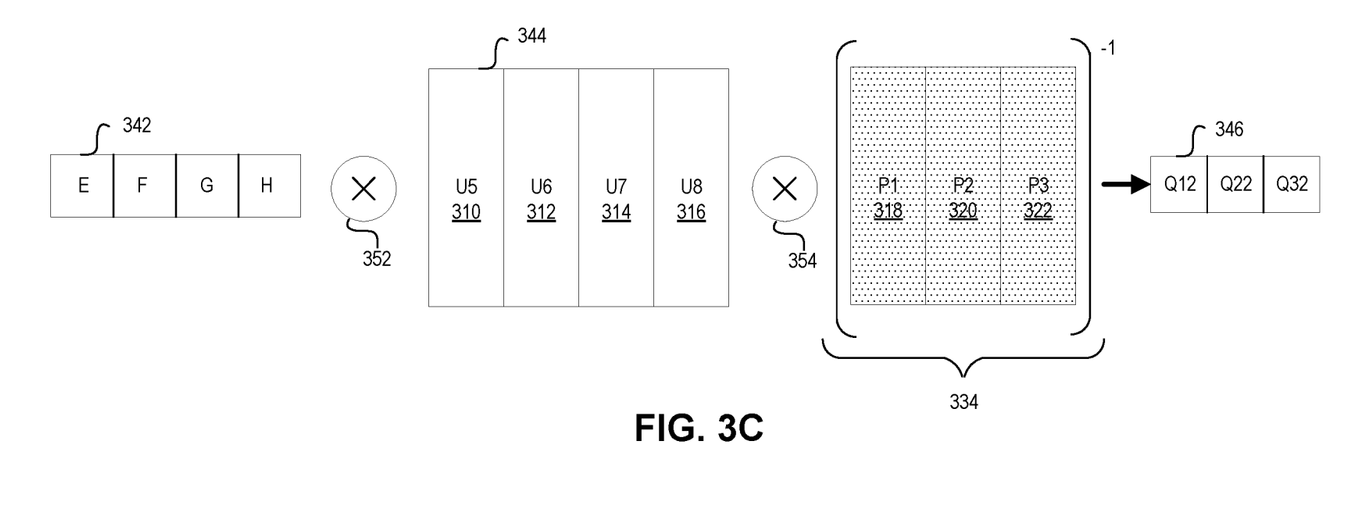
FIG. 3C illustrates an exemplary example for partial erasure coding by using a second half of the parity check matrix, in accordance with an embodiment of the present disclosure.

FIG. 3C illustrates an exemplary example for partial erasure coding by using a second half of the parity check matrix, in accordance with an embodiment of the present disclosure. FIG. 3C represents a second stage in EC using (8+3) EC encoder (element 224 shown in FIG. 2B). In one embodiment, when the storage node in the distributed storage system including a plurality of storage nodes, e.g., eight storage nodes, receives a second portion of data 342, (8+3) EC encoder may use a sub-matrix 344 of parity check matrix 300 to perform partial EC. Specifically, the (8+3) EC encoder may apply a sub-matrix 344 to second portion of data 342 using operation 352, e.g., a matrix multiplication operation, to obtain a second intermediate syndrome. This second intermediate syndrome can then be reversed through an operation 354 with a parity portion 334 of parity check matrix 300 to generate a second intermediate parity 346, e.g., {Q12, Q22, Q32}.

A second EC codeword obtained in this second stage of EC can be denoted as: {E, F, G, H, 0, 0, 0,0, Q12, Q22, Q32}. Note that each intermediate parity fragment in the second intermediate parity 346 can be identified based on their position occupied in the second EC codeword. For example, Q12 can denote a first intermediate party fragment, Q22 can denote a second intermediate party fragment, and Q32 can denote a third intermediate party fragment in the second EC codeword. Similar to the storing and distribution strategy associated with the first EC codeword, the distributed storage system may first save the second EC codeword in the journal associated with the storage node in which the second EC codeword was generated. However, when the system disperses the second EC codeword across the other storage nodes in the distributed storage system, the system may only write {E, F, G, H, Q12, Q22, Q32} into remaining seven storage nodes in the distributed storage system with eight storage nodes in a storage cluster.

The system can distribute the different parity portions in first intermediate parity 334, i.e., {Q11, Q21, Q31}, and second intermediate parity 346, i.e., {Q12, Q22, Q32}, across the storage nodes in the distributed storage system with alignments. Specifically, the system can store Q12 in the same storage node journal where Q11 is stored, Q22 can be stored in the same storage node journal where Q21 is stored, and Q32 can be stored in the same storage node journal where Q31 is stored.

Figure 3D:
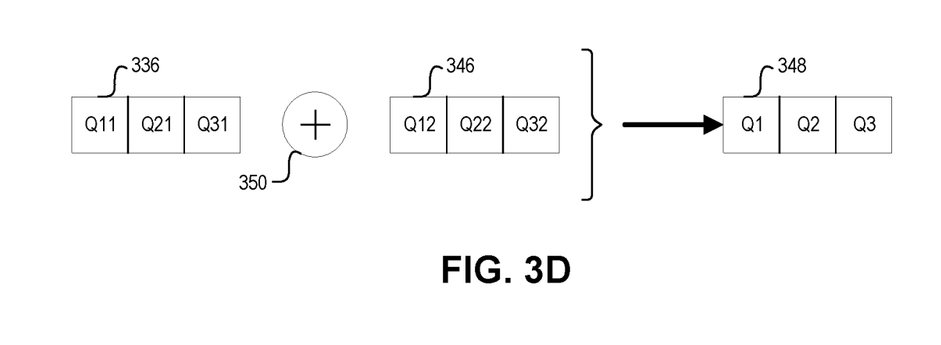
FIG. 3D illustrates an exemplary example for generating an overall parity based on two sets of intermediate parity, in accordance with an embodiment of the present disclosure.

FIG. 3D illustrates an exemplary example for generating an overall parity based on two sets of intermediate parity, in accordance with an embodiment of the present disclosure. The system can generate overall parity 348, i.e., {Q1, Q2, Q3}, for the user data, i.e., {A, B, C, D, E, F, G, H}, by a bit-wise operation 350 of first intermediate parity 336 and second intermediate parity 346. The system can then store each fragment in overall parity 348 in a persistent storage node sharing the same storage node where the corresponding intermediate parity fragments used for generating the overall parity fragment are stored in the journal. Table 1 below provides an example to illustrate a distribution of the first intermediate parity 336, second intermediate parity 346 and the overall parity 348 among storage nodes in the distributed storage system.

TABLE 1

Distribution of parity parts in the distributed storage system

| | STORAGE NODE 1 | STORAGE NODE 2 | STORAGE NODE 3 |
|---|---|---|---|
| JOURNAL | Q11 | Q21 | Q31 |
| | Q12 | Q22 | Q32 |
| DATA STORAGE DRIVE | Q1 = Q11⊕Q12 | Q2 = Q21⊕Q22 | Q3 = Q31⊕Q32 |

Figure 4:
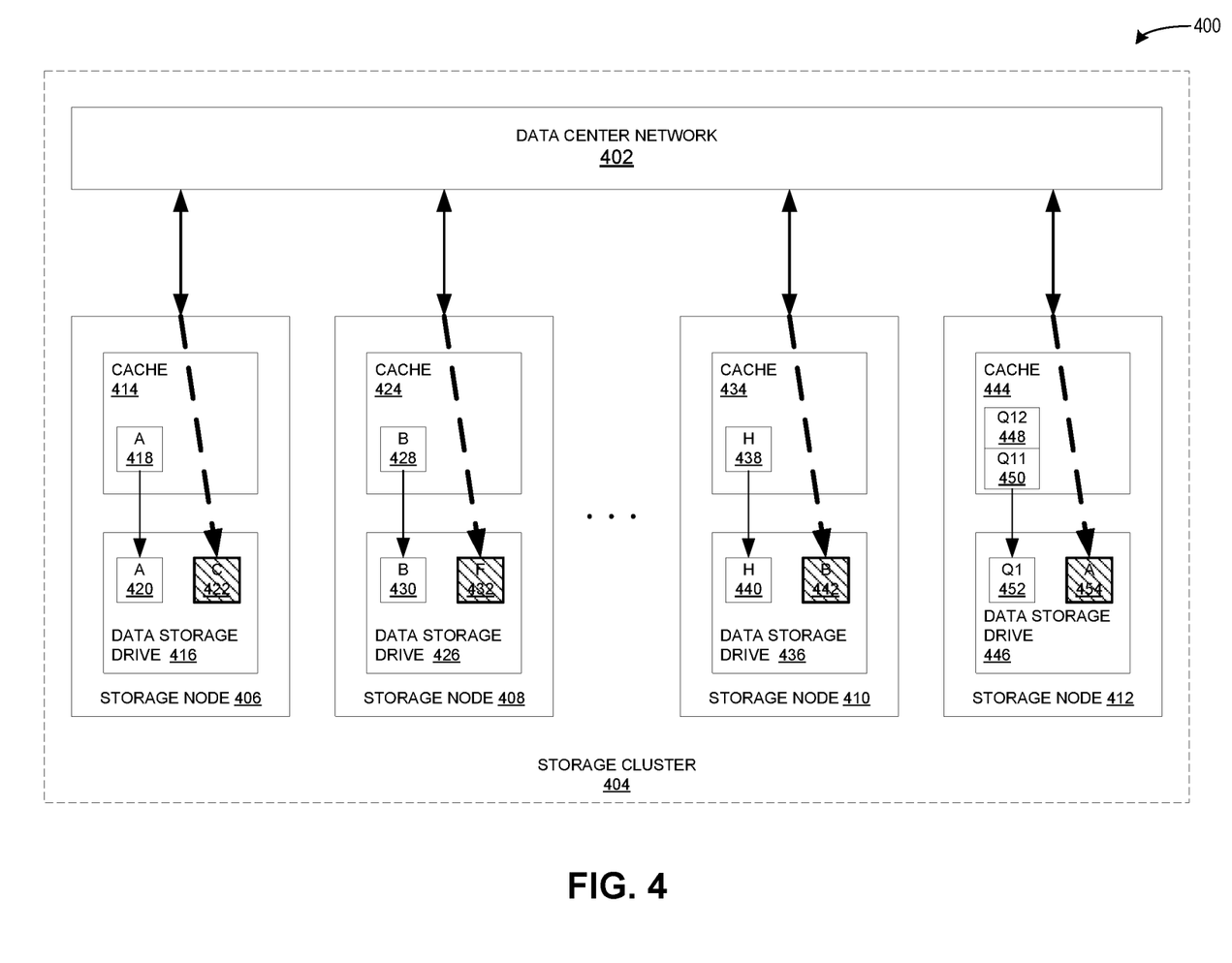
FIG. 4 illustrates an exemplary user data and parity distribution in a distributed storage system, in accordance with an embodiment of the present disclosure.

FIG. 4 illustrates an exemplary user data and parity distribution in a distributed storage system 400, in accordance with an embodiment of the present disclosure. Traditional EC codec's divide and spread the EC codeword randomly among the set of storage nodes 406-412 in a storage cluster 404 of distributed storage system 400. For example, the dashed solid lines indicate how the user data fragments: C 422, F 432, B 442, A 454 are randomly distributed via data center network 402 among the storage nodes 406, 408, 410, and 412 respectively and stored in corresponding data storage drives 416, 426, 436, and 446. Such random distribution of data can result in an increase in the network burden. In one embodiment of the present disclosure, distributed storage system 400 can assign the user data {A, B, C, D, E, F, G, H} and two sets of intermediate parity, i.e., {Q11, Q21, Q31} and {Q12, Q22, Q32} by using a local address matching logic with a journal where the same data is stored temporarily. Furthermore, distributed storage system 400 can first write the user data parts {A, B, C, D, E, F, G, H} to journal or cache 414, 424, and 434, and then can write the two sets of intermediate parity parts into journal 444 with alignments. For example, Q12 448 and Q11 450 can be written into same journal 444.

An advantage of the EC and data distribution scheme described herein can be apparent to distributed storage system 400 when data is flushed from a low-capacity and expensive journal or cache to corresponding data storage drive in the same storage node. FIG. 4 illustrates an example scenario of such data flushing. Specifically, distributed storage system 400 can flush or move user data fragment A 418 from journal 414 to a data storage drive 416 and stored as data A 420 in storage node 406. Similarly, distributed storage system can perform the following flushing or move operations in the other storage nodes by: flushing user data part B 428 in journal 424 to data storage drive 426 and store user data fragment as B 430 in storage node 408; and moving user data part H 438 in journal 434 to data storage drive 436 and store user data fragment as H 440 in storage node 412. The above-described data distribution strategy can be capable of reducing data movement and network traffic in the distributed storage system 400.

Overall parity, e.g., {Q1, Q2, Q3} for the user data {A, B, C, D, E, F, G, H} can be generated according to FIG. 3D, and distributed storage system 400 can store the overall parity in data storage drives in distributed storage system 400. For example, distributed storage system 400 can store intermediate parity parts Q11 and Q12 in journal 444 associated with storage node 412. An overall parity part Q1 452 can be computed by a bit-wise addition of Q11 and Q12. Distributed storage system 400 can store this overall parity Q1 452 in data storage drive 446 sharing same storage node (or server) 412 with journal 444 storing two intermediate parts Q12 448 and Q11 450. Such user data and parity distribution among the storage nodes in distributed storage system 400 can provide a technological solution (by using erasure encoding merging) to the technological problem of unnecessary data movements, suboptimal erasure coding data spreading causing high write amplification, and high burden on CPU cores for performing erasure coding.

In the existing distributed storage systems, a 16-lane NIC's throughput are constrained by Peripheral Component Interconnect express (PCIe) 3.0 and can only achieve 128 Gb. But this 128 Gb/sec throughput is unable to satisfy the applications' desire to solve the mismatch of thin-provisioning and availability of limited resources. Since the distributed storage system 400 of the present disclosure can implement a novel EC scheme in which the journal to drive flushing is performed as a local operation, the burden and the requirements on NIC and CPU is relaxed. Such a feature can provide burden mitigation associated with the internal traffic and could allow the allocation of more bandwidth to handle the front-end request from users, thereby enabling distributed storage system 400 to provide a better match between the applications' requirements and a CPU with future versions of PCIe feature.

In general, embodiments described herein provide efficient EC related innovations for distributed storage system. Specifically, when implementing the novel erasure-coding based merging, the system is capable of providing latency reduction, resource saving, and efficiency enhancement by merging the two sets of erasure coding codecs, and reconstructing the data chunks spread across multiple drives with improved data integrity. The local flushing and parity accumulation operations ensure data quality and the system can allocate saved network bandwidth for applications to achieve stable performance and improved thin-provisioning.

Figure 5:
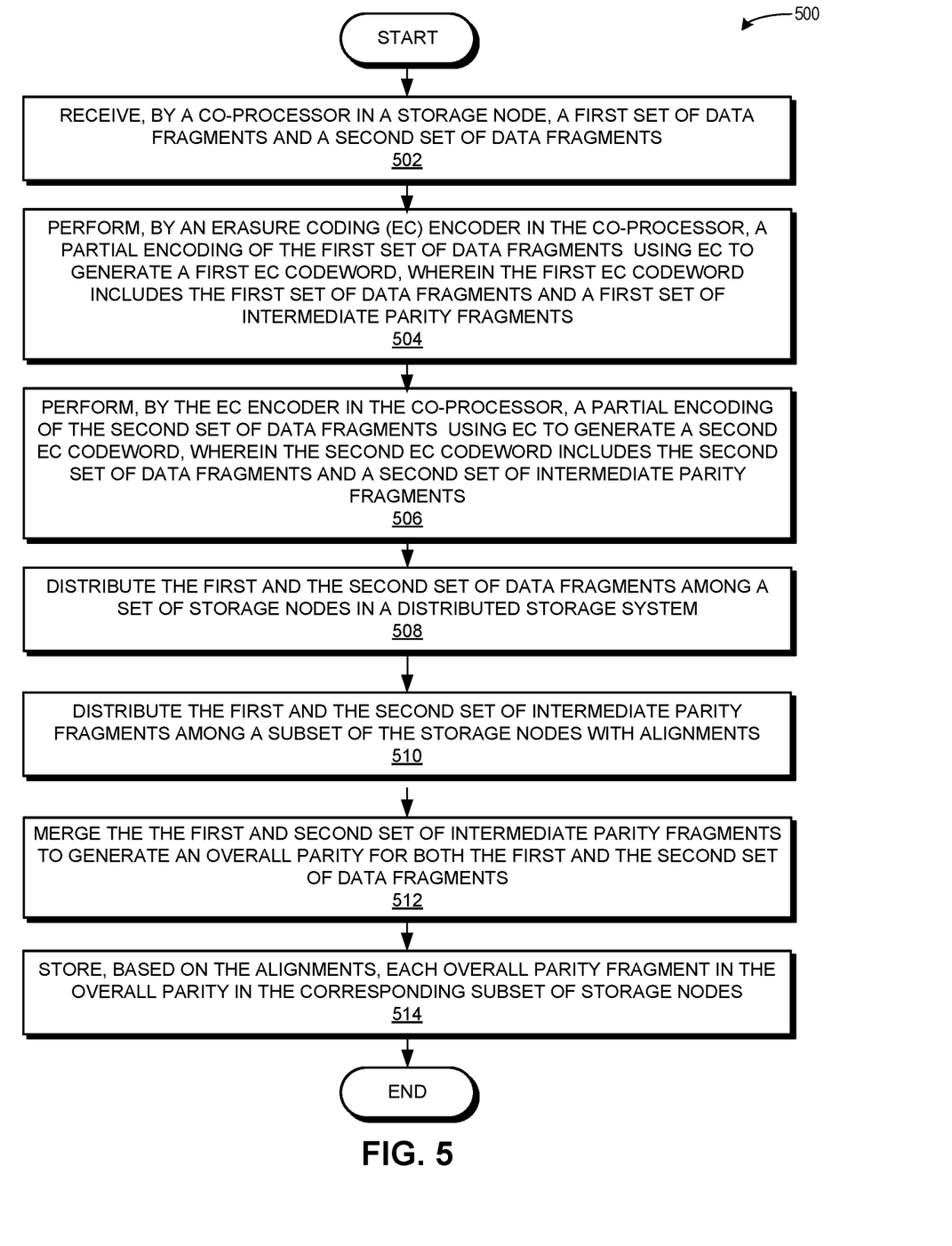
FIG. 5 presents a flowchart illustrating a method for facilitating a novel erasure coding in a distributed storage system, in accordance with an embodiment of the present disclosure.

Exemplary Method for Facilitating Erasure Coding in a Distributed Storage System FIG. 5 presents a flowchart 500 illustrating a method for facilitating a novel erasure coding in a distributed storage system, in accordance with an embodiment of the present disclosure. During operation, the system can receive, by a co-processor in a storage node in a set of storage nodes within the distributed storage system, a first set of data fragments and a second set of data fragments (operation 502). The system can perform, by using an erasure coding (EC) encoder in the co-processor, a partial encoding of the first set of data fragments using EC to generate a first EC codeword (operation 504). The first EC codeword can include the first set of data fragments and a first set of intermediate parity fragments. Next, the system can perform, by using the EC encoder, a partial encoding of the second set of data fragments by using EC to generate a second EC codeword (operation 506). The second EC codeword can include the second set of data fragments and a second set of intermediate parity fragments.

Subsequent to the system generating the first EC codeword and the second EC codeword, the system can distribute the first set of data fragments and the second set of data fragments among the set of storage nodes (operation 508). The system can also distribute the first set of intermediate parity fragments and the second set of intermediate parity fragments among a subset of the set of storage nodes with alignments (operation 510). Next, the system can merge the first set of intermediate parity fragments and the second set of intermediate parity fragments to generate an overall parity for both the first set of data fragments and the second set of data fragments (operation 512). The system can then store, based on the alignments, each overall parity fragment in the overall parity in the corresponding subset of the storage nodes (operation 514).

Exemplary Computer System and Apparatus

Figure 6:
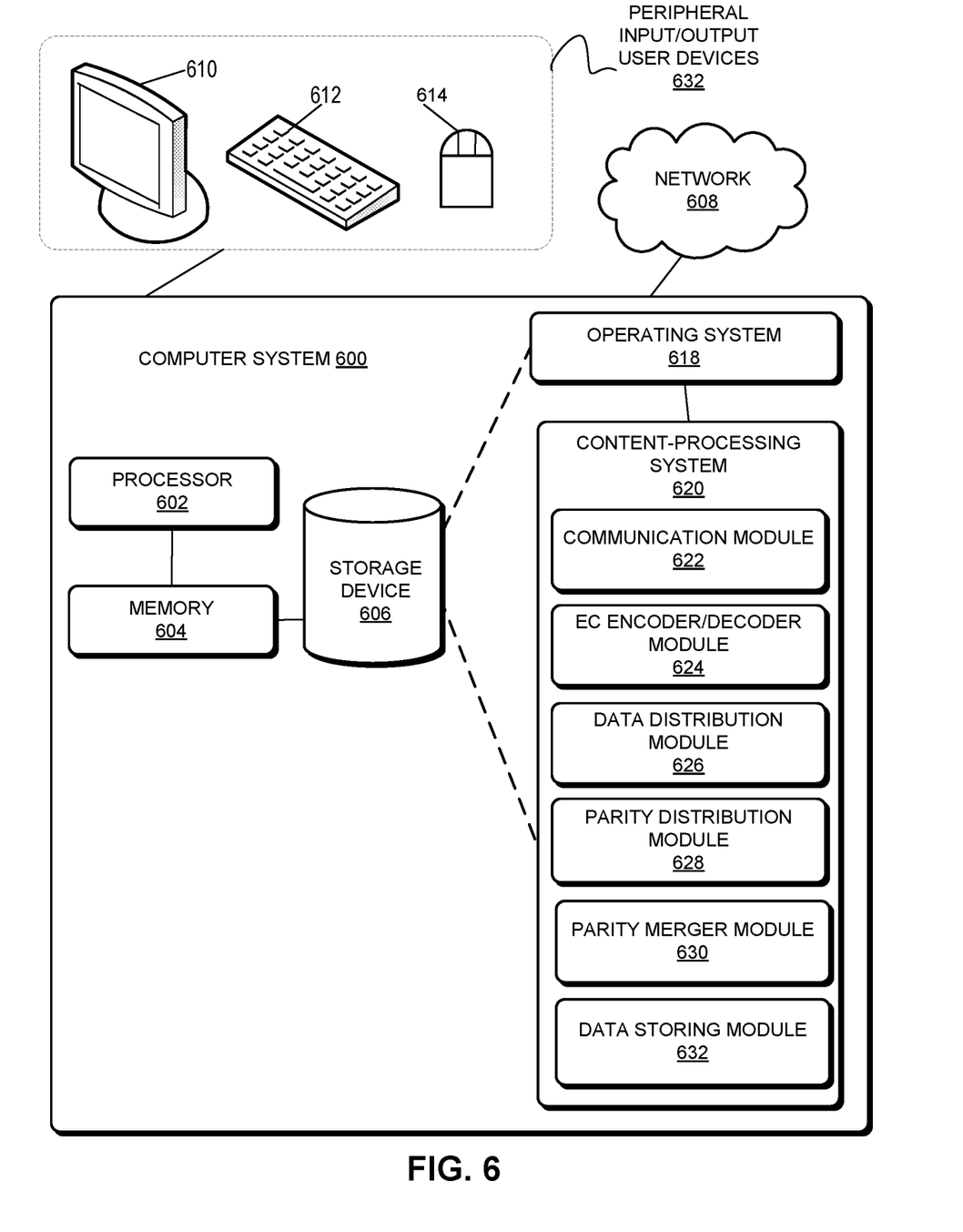
FIG. 6 illustrates an exemplary computer system that facilitates erasure coding in a distributed storage system, in accordance with an embodiment of the present disclosure.

FIG. 6 illustrates an exemplary computer system that facilitates erasure coding in a distributed storage system, according to one embodiment of the present disclosure. Computer system 600 includes a processor 602, a memory 604, and a storage device 606. Computer system 600 can be coupled to a plurality of peripheral input/output devices 632, e.g., a display device 610, a keyboard 612, and a pointing device 614, and can also be coupled via one or more network interfaces to network 608. Storage device 606 can store an operating system 618 and a content processing system 620.

In one embodiment, content processing system 620 can include instructions, which when executed by processor 602 can cause computer system 600 to perform methods and/or processes described in this disclosure. During operation of computer system 600, content processing system 620 can include instructions for receiving a first set of data fragments and a second set of data fragments (communication module 622). Content processing system 620 may further include instructions for performing partial encoding of the first set of data fragments and the second set of data fragments by using an erasure coding codec to generate a first EC codeword and a second EC codeword (EC encoder/decoder module 624). Content processing system 620 may then distribute the first set of data fragments and the second set of data fragments among a set of storage nodes (data distribution module 626).

Content processing system 620 may further be configured to distribute a first intermediate parity and a second intermediate parity associated with the first EC codeword and the second EC codeword respectively, among the set of storage nodes with alignments (parity distribution module 628). Content processing system 620 may merge the first intermediate parity and the second intermediate parity by performing bit-wise addition to obtain an overall parity for both the first portion of data and the second portion of data (parity merger module 630).

Content processing system 620 may further be configured to first store data fragments in the first set of data fragments and the second set of data fragments in a journal associated with a storage node. Similarly, content processing system 620 may first store intermediate parity fragments from the first intermediate parity and second intermediate parity among the storage nodes in a journal with alignments. Content processing system 620 may then be configured to move the data fragments and the overall parity fragments (after an overall parity is computed using the intermediate parity fragments) from their respective journals to their corresponding data storage drives sharing the same storage node (data storing module 632). In some embodiments, modules 622-632 can be partially or entirely implemented in hardware and can be part of the processor 602.

Figure 7:
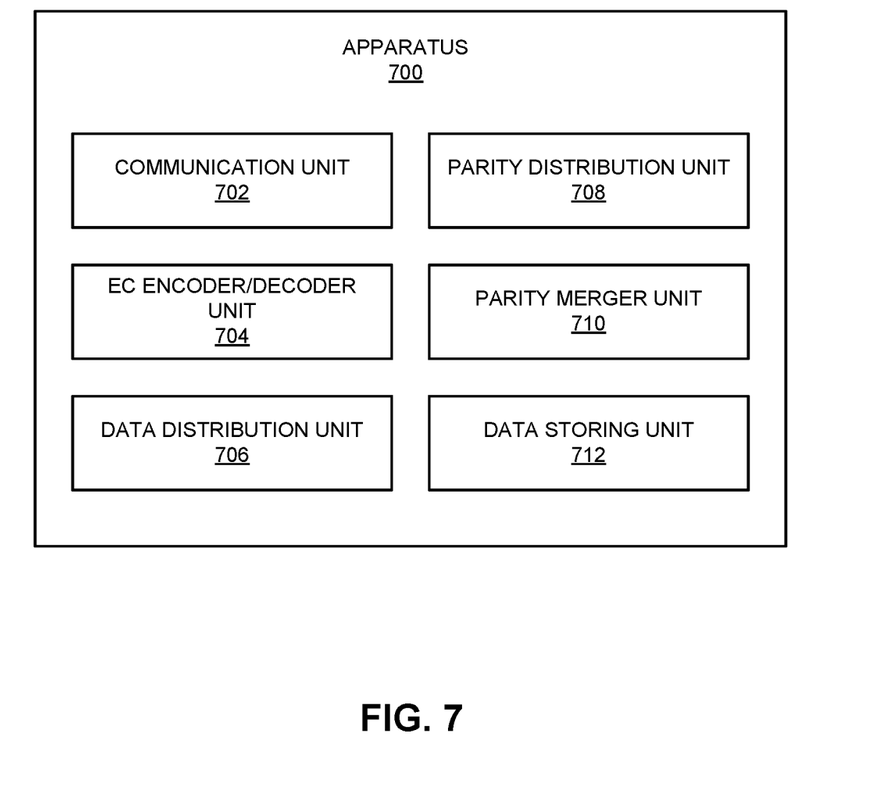
FIG. 7 illustrates an exemplary apparatus that facilitates erasure coding in a distributed storage system, in accordance with an embodiment of the present disclosure.

FIG. 7 illustrates an exemplary apparatus that facilitates erasure coding in a distributed storage system, according to one embodiment of the present disclosure. Apparatus 700 can include a plurality of units or apparatuses that may communicate with one another via a wired, wireless, quantum light, or electrical communication channel. Apparatus 700 may be realized using one or more integrated circuits, and may include fewer or more units or apparatuses than those shown in FIG. 7. Further, apparatus 700 may be integrated in a computer system, or realized as a separate device that is capable of communicating with other computer systems and/or devices. Specifically, apparatus 700 can include units 702-712, which perform functions or operations similar to modules 622-632 of computer system 600 in FIG. 6, and, including: a communication unit 702, an EC encoder/decoder unit 704, a data distribution unit 706, a parity distribution unit 708, a parity merger unit 710, and a data storing unit 712.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A computer-implemented method, comprising:
   receiving, by a co-processor in a storage node, a first set of data fragments and a second set of data fragments;
   performing, by an erasure coding (EC) encoder in the co-processor, a partial encoding of the first set of data fragments and the second set of data fragments using EC to generate a first EC codeword and a second EC codeword, respectively, wherein the first EC codeword and the second EC codeword include a first set of intermediate parity fragments and a second set of intermediate parity fragments, respectively;
   distributing the first set of data fragments and the second set of data fragments among a first subset of storage nodes in a set of storage nodes in a distributed storage system;
   distributing the first set of intermediate parity fragments and the second set of intermediate parity fragments among a second subset of the storage nodes with alignments;
   merging the first set of intermediate parity fragments and the second set of intermediate parity fragments to generate an overall parity for both the first set of data fragments in the first EC codeword and the second set of data fragments in the second EC codeword; and
   storing, based on the alignments, each overall parity fragment in the overall parity in the corresponding second subset of the storage nodes.

2. The method of claim 1, wherein distributing the first set of data fragments and the second set of data fragments among the first subset of storage nodes in the set of storage nodes comprises:
   assigning each data fragment in the first set of data fragments and the second set of data fragments based on local address matching associated with a journal where the same data fragment is stored temporarily.

3. The method of claim 1, wherein distributing the first set of intermediate parity fragments and the second set of intermediate parity fragments among the second subset of storage nodes with alignments comprises:
   storing each fragment in the first set of intermediate parity fragments in a journal on a separate storage node in the second subset of the storage nodes, wherein each intermediate parity fragment is associated with a different position in the first EC codeword; and
   storing each fragment in the second set of intermediate parity fragments in the same journal on the same storage node as the corresponding intermediate parity fragment in the first set of intermediate parity fragments sharing a same position in the second EC codeword.

4. The method of claim 1, wherein merging the first set of intermediate parity fragments and the second set of intermediate parity fragments to generate an overall parity for both the first set of data fragments in the first EC codeword and the second set of data fragments in the second EC codeword comprises:
   generating the overall parity by performing a bit-wise addition of each intermediate parity fragment in the first set of intermediate parity fragments with a corresponding intermediate parity fragment in the second set of intermediate parity fragments.

5. The method of claim 1, further comprising:
   when the overall parity is generated, copying locally, by each co-processor associated with a storage node, —each data fragment in the first set of data fragments and the second set of data fragments from a corresponding journal to a persistent data storage drive in the same storage node, thereby reducing data movement and network traffic in the distributed storage system.

6. The method of claim 1, wherein storing, based on the alignments, each overall parity fragment in the overall parity in the corresponding second subset of the storage nodes comprises:
   storing each overall parity fragment in a persistent data storage drive associated with a same storage node where corresponding intermediate parity fragments used for computing the overall parity fragment are stored in a journal, wherein the intermediate parity fragments are associated with the first set of intermediate parity fragments and the second set of intermediate parity fragments.

7. The method of claim 1, wherein each storage node is coupled to other storage nodes in the set of storage nodes via a data center network.

8. The method of claim 1, wherein each storage node in the set of storage nodes includes:
   a central processing unit (CPU) complex;
   the co-processor including the EC encoder for performing EC;
   an interface for communications between the CPU complex and the co-processor;
   a journal; and
   a persistent data storage drive.

9. A computer system, comprising:
   a co-processor; and
   a storage device coupled to the processor and storing instructions, which when executed by the co-processor cause the co-processor to perform a method, the method comprising:
   receiving, by a co-processor in a storage node, a first set of data fragments and a second set of data fragments;
   performing, by an erasure coding (EC) encoder in the co-processor, a partial encoding of the first set of data fragments and the second set of data fragments using EC to generate a first EC codeword and a second EC codeword, respectively, wherein the first EC codeword and the second EC codeword include a first set of intermediate parity fragments and a second set of intermediate parity fragments, respectively;

distributing the first set of data fragments and the second set of data fragments among a first subset of storage nodes in a set of storage nodes in a distributed storage system;

distributing the first set of intermediate parity fragments and the second set of intermediate parity fragments among a second subset of the storage nodes with alignments;

merging the first set of intermediate parity fragments and the second set of intermediate parity fragments to generate an overall parity for both the first set of data fragments in the first EC codeword and the second set of data fragments in the second EC codeword; and storing, based on the alignments, each overall parity fragment in the overall parity in the corresponding second subset of the storage nodes.

10. The computer system of claim 9, wherein distributing the first set of data fragments and the second set of data fragments among the first subset of storage nodes in the set of storage nodes comprises:

assigning each data fragment in the first set of data fragments and the second set of data fragments based on local address matching associated with a journal where the same data fragment is stored temporarily.

11. The computer system of claim 9, wherein distributing the first set of intermediate parity fragments and the second set of intermediate parity fragments among the second subset of storage nodes with alignments comprises:

storing each fragment in the first set of intermediate parity fragments in a journal on a separate storage node in the second subset of the storage nodes, wherein each intermediate parity fragment is associated with a different position in the first EC codeword; and storing each fragment in the second set of intermediate parity fragments in the same journal on the same storage node as the corresponding intermediate parity fragment in the first set of intermediate parity fragments sharing a same position in the second EC codeword.

12. The computer system of claim 9, wherein merging the first set of intermediate parity fragments and the second set of intermediate parity fragments to generate an overall parity for both the first set of data fragments in the first EC codeword and the second set of data fragments in the second EC codeword comprises:

generating the overall parity by performing a bit-wise addition of each intermediate parity fragment in the first set of intermediate parity fragments with a corresponding intermediate parity fragment in the second set of intermediate parity fragments.

13. The computer system of claim 9, wherein the method further comprises:

when the overall parity is generated, copying locally, by each co-processor associated with a storage node, each data fragment in the first set of data fragments and the second set of data fragments from a corresponding journal to a persistent data storage drive in the same storage node, thereby reducing data movement and network traffic in the distributed storage system.

14. The computer system of claim 9, wherein storing, based on the alignments, each overall parity fragment in the overall parity in the corresponding second subset of the storage nodes comprises:

storing each overall parity fragment in a persistent data storage drive associated with a same storage node where corresponding intermediate parity fragments used for computing the overall parity fragment are stored in a journal, wherein the intermediate parity fragments are associated with the first set of intermediate parity fragments and the second set of intermediate parity fragments.

15. The computer system of claim 9, wherein each storage node in the set of storage nodes includes:

a central processing unit (CPU) complex;

the co-processor including the EC encoder for performing EC;

an interface for communications between the CPU complex and the co-processor;

a journal; and a persistent data storage drive.

16. An apparatus, comprising:

a co-processor; and a storage medium storing instructions, which when executed by the co-processor cause the co-processor to perform a method, the method comprising:

receiving, by a co-processor in a storage node, a first set of data fragments and a second set of data fragments;

performing, by an erasure coding (EC) encoder in the co-processor, a partial encoding of the first set of data fragments and the second set of data fragments using EC to generate a first EC codeword and a second EC codeword, respectively, wherein the first EC codeword and the second EC codeword include a first set of intermediate parity fragments and a second set of intermediate parity fragments, respectively;

distributing the first set of data fragments and the second set of data fragments among a first subset of storage nodes in a set of storage nodes in a distributed storage system;

distributing the first set of intermediate parity fragments and the second of intermediate parity fragments among a second subset of the storage nodes with alignments;

merging the first set of intermediate parity fragments and the second set of intermediate parity fragments to generate an overall parity for both the first set of data fragments in the first EC codeword and the second set of data fragments in the second EC codeword; and storing, based on the alignments, each overall parity fragment in the overall parity in the corresponding second subset of the storage nodes.

17. The apparatus of claim 16, wherein distributing the first set of data fragments and the second set of data fragments among the first subset of storage nodes in the set of storage nodes comprises:

assigning each data fragment in the first set of data fragments and the second set of data fragments based on local address matching associated with a journal where the same data fragment is stored temporarily.

18. The apparatus of claim 16, wherein distributing the first set of intermediate parity fragments and the second set of intermediate parity fragments among the second subset of storage nodes with alignments comprises:

storing each fragment in the first set of intermediate parity fragments in a journal on a separate storage node in the second subset of the storage nodes, wherein each fragment is associated with a different position in the first EC codeword; and;

storing each fragment in the second set of intermediate parity fragments in the same journal on the same storage node as the corresponding intermediate parity fragment in the first set of intermediate parity fragments sharing a same position in the second EC codeword.

19. The apparatus of claim 16, wherein merging the first set of intermediate parity fragments and the second set of intermediate parity fragments to generate an overall parity the first set of data fragments in the first EC codeword and the second set of data fragments in the second EC codeword comprises:

generating the overall parity by performing a bit-wise addition of each intermediate parity fragment in the first set of intermediate parity fragments with a corresponding intermediate parity fragment in the second set of intermediate parity fragments.

20. The apparatus of claim 16, wherein the method further comprising:

when the overall parity is generated, copying locally, by each co-processor associated with a storage node, each data fragment in the first set of data fragments and the second set of data fragments from a corresponding journal to a persistent data storage drive in the same storage node, thereby reducing data movement and network traffic in the distributed storage system.

\* \* \* \* \*